US006782331B2

(12) United States Patent
Ayadi (10) Patent No.: US 6,782,331 B2
(45) Date of Patent: Aug. 24, 2004

(54) GRAPHICAL USER INTERFACE FOR TESTING INTEGRATED CIRCUITS

(75) Inventor: Kamel Ayadi, Puchheim (TN)

(73) Assignee: Infineon Technologies AG, Munich ( * ) Notice: Subject to any disclaimer, the term of this patent is extended or adjusted under 35 U.S.C. 154(b) by 0 days.

(21) Appl. No.: 10/032,876

(22) Filed: Oct. 24, 2001

(65) Prior Publication Data

US 2003/0078748 A1 Apr. 24, 2003

(51) Int. Cl.[7] .............................................. G01R 31/28
(52) U.S. Cl. ........................... 702/68; 702/81; 702/84; 702/117; 702/118; 702/120; 702/121; 702/122
(58) Field of Search ............................. 702/68, 81, 82, 702/83, 84, 117, 118, 120–124; 438/14, 17; 324/73.1, 538, 548, 754, 755, 756, 759, 761, 765

(56) References Cited

U.S. PATENT DOCUMENTS

| | | | |
|---|---|---|---|
| 5,206,582 A | * | 4/1993 | Ekstedt et al. .............. 324/73.1 |
| 5,349,539 A | | 9/1994 | Moriyasu |
| 5,726,920 A | * | 3/1998 | Chen et al. .................. 702/108 |
| 5,861,882 A | | 1/1999 | Sprenger et al. |
| 5,968,191 A | * | 10/1999 | Thatcher et al. ............ 714/723 |
| 5,986,281 A | * | 11/1999 | Burchanowski et al. ...... 257/48 |
| 6,113,646 A | * | 9/2000 | Holden ............................ 716/4 |
| 6,124,725 A | * | 9/2000 | Sato ............................ 324/765 |
| 6,223,098 B1 | * | 4/2001 | Cheong et al. ............. 700/223 |
| 6,362,013 B1 | * | 3/2002 | Yoshimura .................... 438/14 |
| 6,484,116 B1 | * | 11/2002 | Yokoyama .................. 702/119 |
| 6,633,175 B1 | * | 10/2003 | Evans et al. ................. 324/754 |
| 2002/0000826 A1 | * | 1/2002 | Takao .......................... 324/765 |
| 2002/0044476 A1 | * | 4/2002 | Nuxoll et al. ................. 365/63 |
| 2002/0145432 A1 | * | 10/2002 | Allard et al. ................ 324/458 |
| 2002/0152046 A1 | * | 10/2002 | Velichko et al. ............ 702/117 |
| 2002/0199142 A1 | * | 12/2002 | Gefen ......................... 714/724 |

OTHER PUBLICATIONS

Michejda, J. and Kim, S. K., "A Precision CMOS Bandgap Reference", *IEEE Journal of Solid–State Circuits*, vol. SC–19, No. 6, 1014–1021, 1984.

Sylvester et al., "Investigation of Interconnect Capacitance Characterization Using Charge–Based Capacitance Measurement (CBCM) Technique and Three–Dimensional Simulation", *IEEE Journal of Solid–State Circuits*, vol. 33, No. 3, 449–453, 1998.

* cited by examiner

*Primary Examiner*—Marc S. Hoff
*Assistant Examiner*—Carol S Tsai
(74) *Attorney, Agent, or Firm*—Fish & Richardson P.C.

(57) ABSTRACT

A system that includes a graphical user interface (GUI) connected to an input/output device of a computer system and one or more test instruments producing a set of electrical signals. The system also includes a probe card that has a multiple probe needles used for measuring electronic characteristics of each of the devices on a semiconductor wafer. Each device has cells. Each cell has a set of bond pads. The system also has a matrix switch and an interface conduit electrically connecting the one or more test instruments, the computer, the probe card, and the matrix switch together. The semiconductor wafer is moved so that the probe needles measure the electrical characteristics of each cell for each device selected for testing.

32 Claims, 10 Drawing Sheets

GRAPHICAL USER INTERFACE FOR TESTING INTEGRATED CIRCUITS

TECHNICAL FIELD

This invention relates to a graphical user interface for testing integrated circuits.

BACKGROUND

Some semiconductor manufacturing processes test integrated circuits (ICs) while the ICs are still a part of a semiconductor wafer. This is commonly referred to as semiconductor wafer level testing (WLT). Typically, WLT involves placing a semiconductor wafer in a vacuum chuck. A probe card that has probe needles is placed in contact with a set of bond pads on each of the ICs. The probes are used to transmit electrical signals to the ICs from a set of test instruments and to receive the corresponding electrical response.

SUMMARY

In one aspect of the invention, system includes a graphical user interface (GUI) connected to an input/output device of a computer system and one or more test instruments producing a set of electrical signals. The system also includes a probe card that has multiple probe needles used for measuring the electronic characteristics of each of the devices on a semiconductor wafer. Each device has cells. Each cell has a set of bond pads. The system also has a matrix switch and an interface conduit electrically connecting the one or more test instruments, the computer, the probe card, and the matrix switch together. The semiconductor wafer is moved so that the probe needles measure the electrical characteristics of each cell within each device selected for testing.

Other embodiments may include one or more of the following features. The user can select a test configuration by interfacing the matrix switch through the GUI. The user can also select either an automatic test mode or a manual test mode. The automatic test mode includes selecting which devices on the semiconductor wafer to test. The manual test mode includes the user setting the electrical signals of the test instruments through the GUI. The probe card transmits a set of electrical signals from each test instrument through the probe needles to each set of bond pads and generates a test result for each device that is displayed graphically on the display. The test instruments include a pulse generator and a parametric analyzer. Testing can include measuring a silicon band gap voltage. Testing can also include measuring for a capacitance.

In another aspect of the invention, a method includes selecting a test configuration using the GUI and measuring a set of electrical characteristics of each device selected for testing. Each device has cells and each cell has a set of bond pads. The semiconductor wafer is moved so that the probe needles measure the electrical characteristics of each cell within each device selected for testing.

Other embodiments may include one or more of the following features. The method can include sending a signal to activate a set of test instruments. In addition, the method may include determining if the test instruments are electrically connected. Other features can include designating if testing is an automatic test mode or a manual test mode where the automatic test mode includes selecting devices on a semiconductor wafer for testing and the manual test mode includes the user setting the electrical signals of the test instruments through the GUI. The method can also include generating an output file for all devices tested and/or graphing the data in the output file on a display. The test instruments can include a pulse generator and a parametric analyzer. Testing can include measuring a silicon band gap voltage. Testing can also include measuring for a capacitance.

In still another aspect of the invention, an apparatus includes a memory that stores executable instructions and a processor. The processor executes instructions to select a test configuration using the GUI, and measure a set of electrical characteristics of each device selected for testing. Each device has cells and each cell has a set of bond pads. The semiconductor wafer is moved so that the probe needles measure the electrical characteristics of each cell within each device selected for testing.

Other embodiments may include one or more of the following features. The apparatus includes instructions that cause the machine to send a signal to activate a set of test instruments. The apparatus also includes instructions that cause the machine to determine if the set of test instruments are electrically connected. The instructions cause the machine to designate if testing is an automatic test mode or a manual test mode. The automatic test mode includes selecting devices on a semiconductor wafer for testing. The manual test mode includes the user setting the electrical signals of the test instruments through the GUI. The instructions that cause the machine to generate an output file for all devices tested and to graph data in the output file on a display. The testing includes testing a silicon band gap voltage. The testing includes a measuring a capacitance.

In a still another aspect an article includes a machine-readable medium that stores executable instructions for testing devices on a semiconductor wafer. The instructions causing a machine to select a test configuration using the GUI, and to measure a set of electrical characteristics of each device selected for testing. Each device has cells and each cell has bond pads. The semiconductor wafer is moved so that the probe needles measure the electrical characteristics of each cell for each device selected for testing.

Other embodiments may include one or more of the following features. The article includes instructions that cause the machine to send a signal to activate a plurality of test instruments. The article also includes instructions that cause the machine to determine if the plurality of test instruments are electrically connected. The instructions cause the machine to designate if testing is an automatic test mode or a manual test mode. The automatic test mode includes selecting devices on a semiconductor wafer for testing. The manual test mode includes the user setting the electrical signals of the test instruments through the GUI. The instructions cause the machine to generate an output file for all devices tested and to graph data in the output file on a display. The test instruments include a pulse generator and a parametric analyzer. The testing includes measuring a silicon band gap voltage. The testing also includes measuring a capacitance.

Each of the aspects above have the following advantages. The method allows for the automated testing of different cells on the IC without damage to the IC or the rest of the semiconductor wafer from the probe needles. By automating the testing process with the IC, testing is done faster and components within the ICs are also tested.

DETAILED DESCRIPTION

Figure 1:
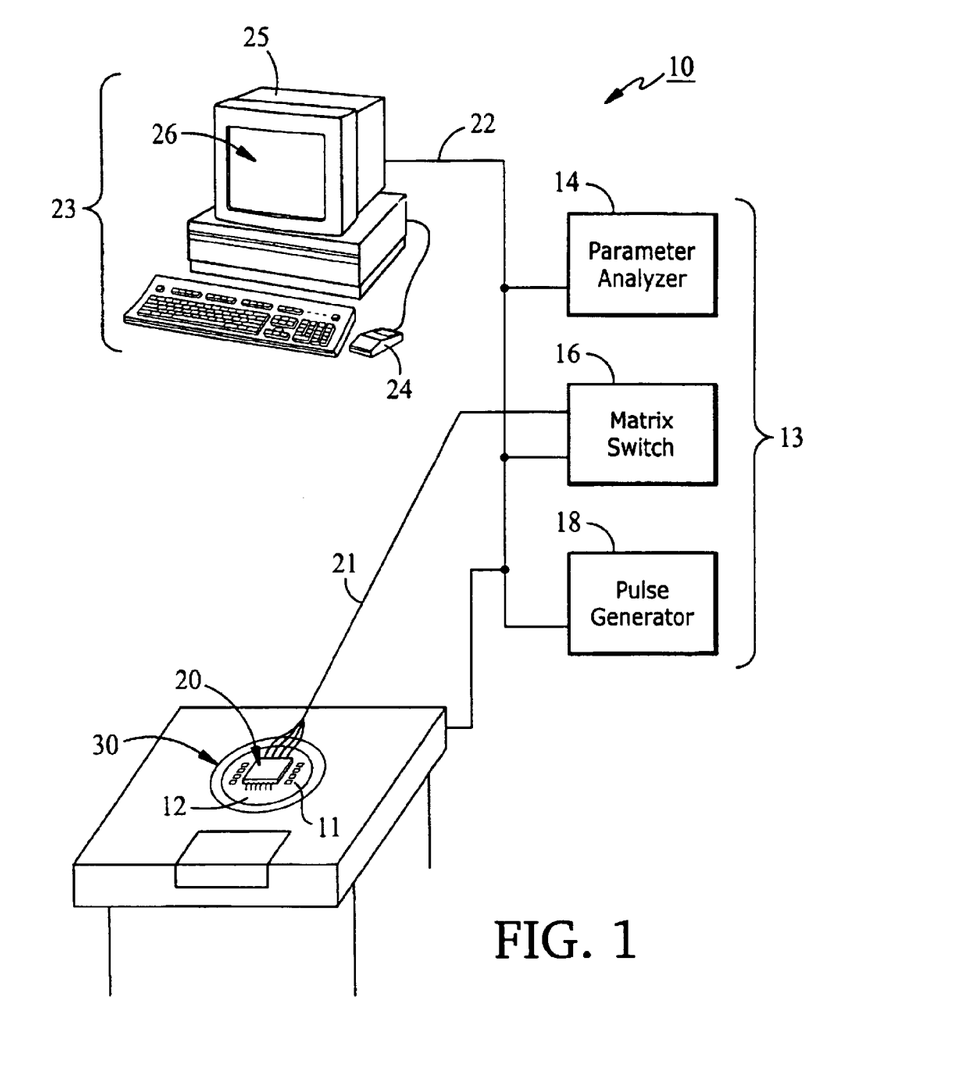
FIG. 1 is a functional diagram of a test system.

Referring to FIG. 1, a test system 10 for measuring the electrical characteristics of a matrix of integrated circuit (IC) 11 on a semiconductor wafer 12 includes, for example, a set of instruments 13, which include a parametric analyzer 14, a matrix switch 16, and a pulse generator 18. Parametric analyzer 14 performs a parametric analysis in which all design variables, except one, are held constant. As an independent or "free" variable is systematically altered, a user evaluates the changes to the test using some kind of measure of merit. Matrix switch 16 provides a switch to channel the input signals received in test system 10 and routes the signals to various output ports that are ultimately connected to the matrix of ICs 11. Pulse generator 18 provides pulsed signals to test system 10.

Test system 10 also includes a probe card 20 that is connected to matrix switch 16 by electrical coaxial 21. Via the interface cable 22, a computer 23 with a mouse 24, a monitor 25 and a graphical user interface (GUI) 26, controls a probe station 28 having a vacuum chuck 30 that holds semiconductor wafer 12, and the set of instruments 13. Probe card 20 is fixed with screws to probe station 28. More specifically, a user (not shown), utilizing GUI 26 controls the movements of chuck 30 and moves semiconductor wafer 12 along probe card 20 to collect electrical data from the matrix of ICs 11.

Figure 2:
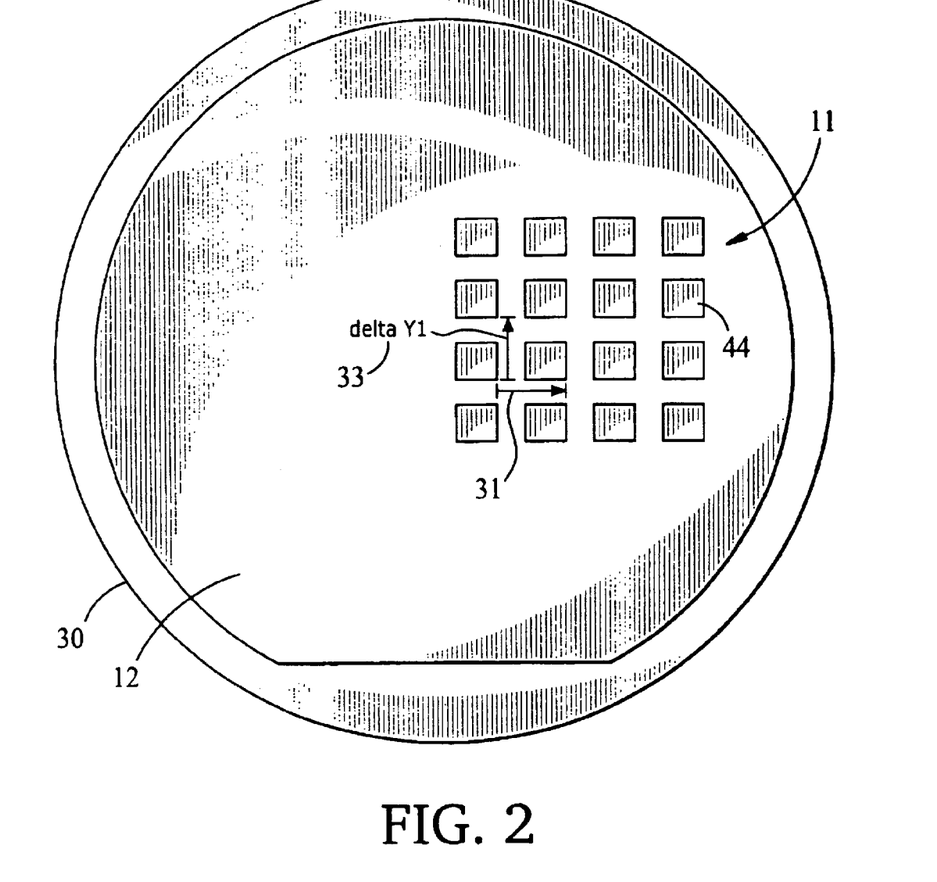
FIG. 2 is a top view of a semiconductor wafer showing a matrix of integrated circuits (IC).

Referring to FIG. 2, each semiconductor wafer 12 includes the matrix of ICs 11. The matrix of ICs 11 are spaced apart by a distance or multiples of the distance, delta X1 31 and a second distance or multiples of the second distance, delta Y1 33.

Figure 3:
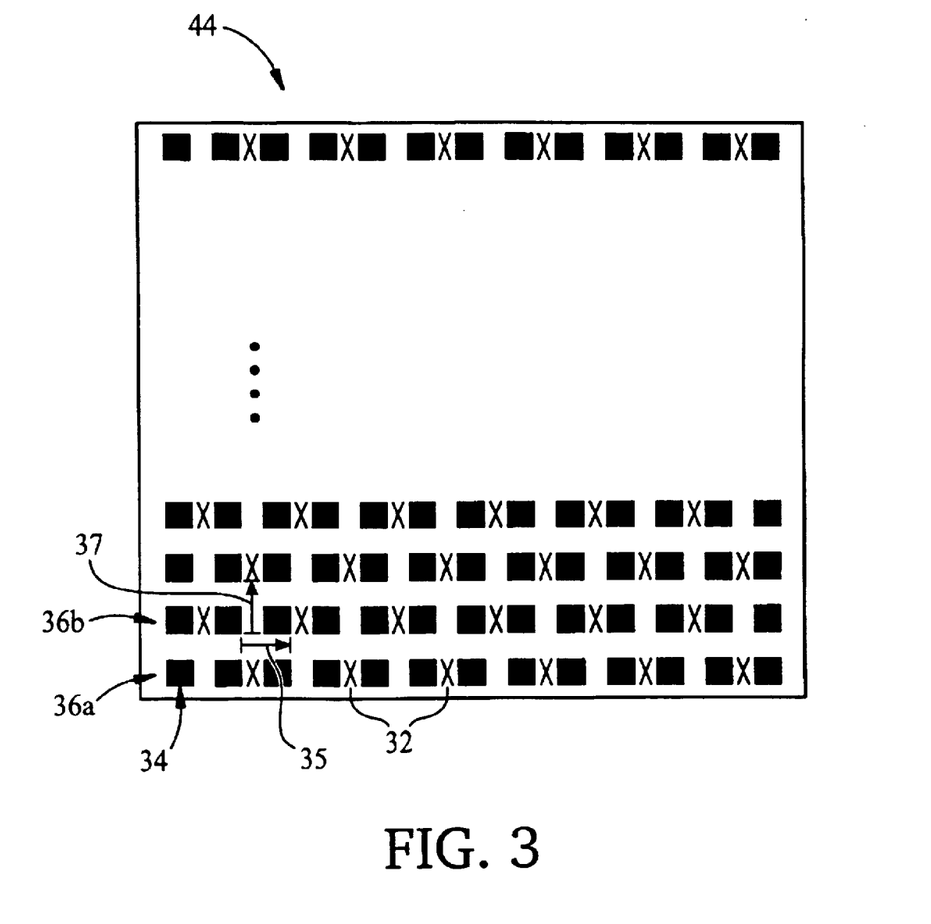
FIG. 3 is a top view of the IC with a matrix of cells.

Referring to FIG. 3, each IC 44 includes cells 32 in rows 36a and 36b. Cells 32 are subcomponents of IC 44, which are electrical structures such as capacitors, memory cells, etc. Each of the cells 32 has two bond pads 34, each electrically connected to cell 32. Bond pads 34 are spaced apart by a distance, delta X2 35, and a second distance, delta Y2 37.

Figure 4:
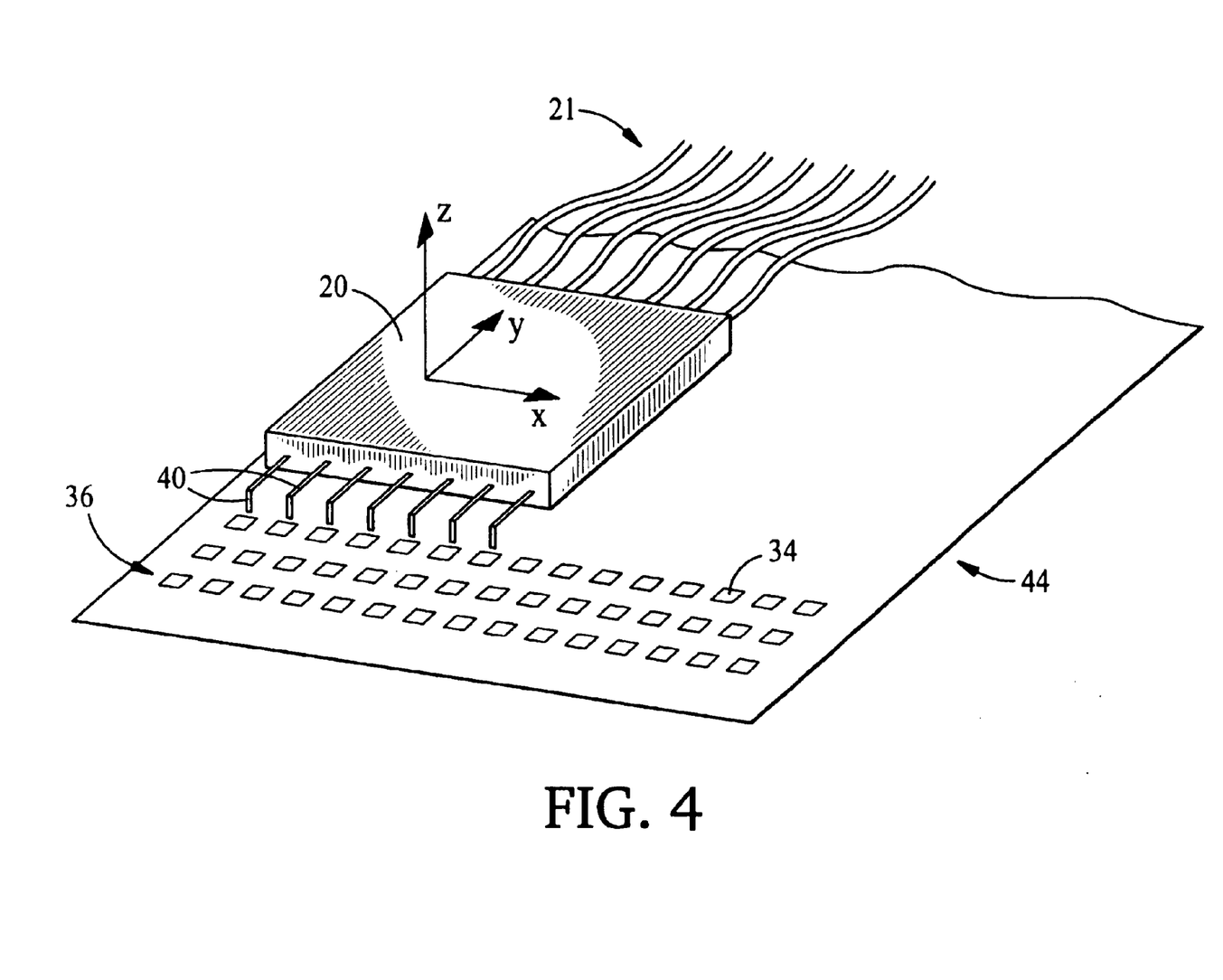
FIG. 4 is angle view of a probe card on the IC.

Referring to FIG. 4, during electrical measurements, probe card 20 with probe needles 40 is placed in contact with bond pads 34 so that one probe needle is in contact with one pad 34. Electrical signals received from test instruments 13 are sent to probe card 20 to each IC 44 via bond pads 34. After probe card 20 tests one set of pads in IC 44, computer 23 sends commands to probe station 28 to move chuck 30 holding semiconductor wafer 12 in a negative z-direction so that semiconductor wafer 12 and the matrix of ICs 11 move down and away from probe needles 40. In addition, computer 23 sends commands to probe station 28 to move chuck 30 in the x-y plane. Computer 23 then moves chuck 30 in an upward or a positive z-direction so that probe needles 40 are in contact with a new set of bond pads 34 so that new electrical measurements may be taken.

Figure 5:
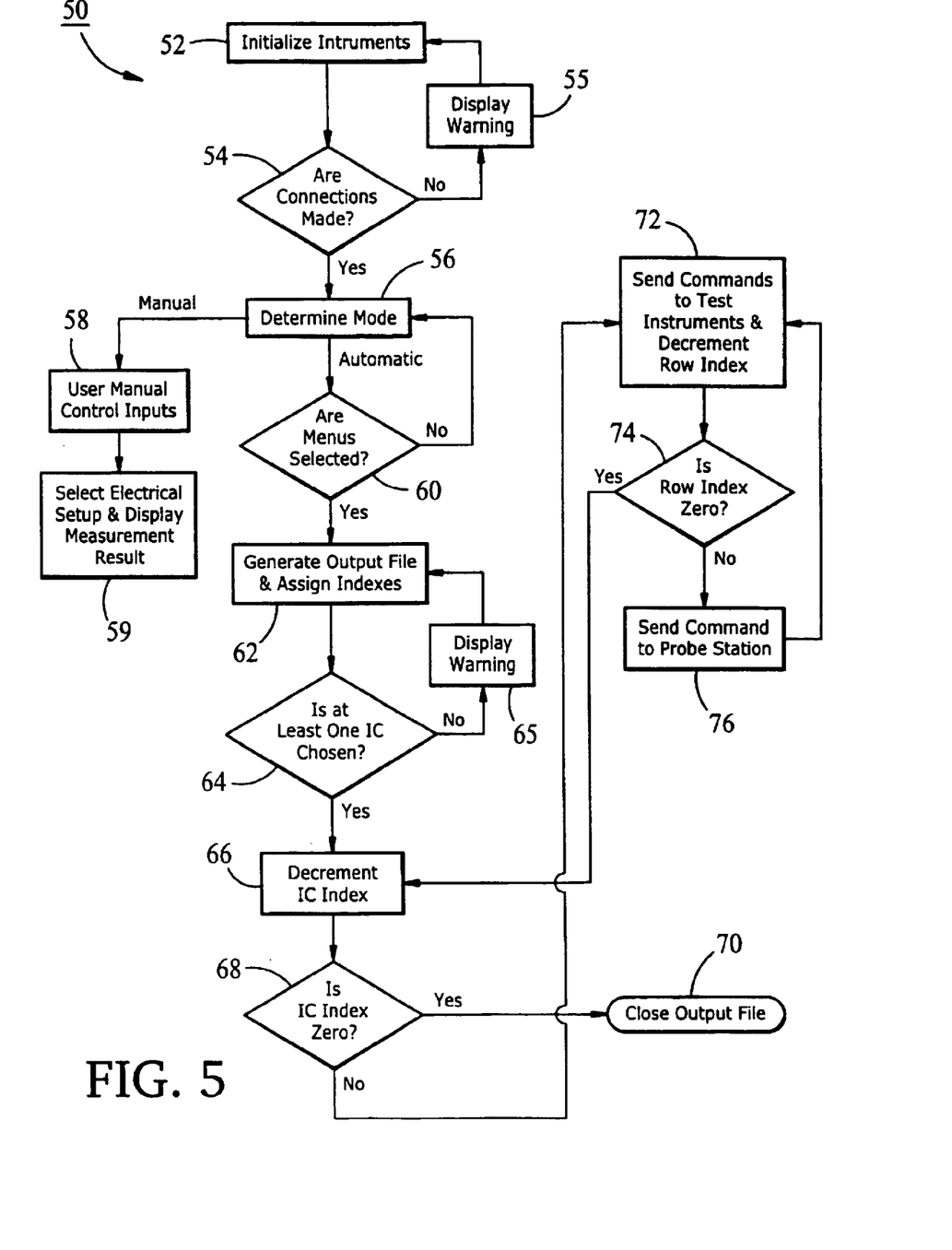
FIG. 5 is flow diagram for a process for testing ICs.

Referring to FIG. 5, a process 50 to test the matrix of ICs 11 using GUI 26 is shown. GUI 26 allows the user (not shown) to provide inputs to test system 10 through menu driven commands. These user inputs allow test system 10 to record electrical measurements of each IC 44 and to present the data graphically to the user using GUI 26.

Process 50 initializes (52) test instruments 13 by sending a signal from computer 23 through interface cable 22 to each of the instruments. Process 50 checks (54) test instruments 13 to ensure each are properly connected to interface cable 22. If a bad connection exists, a warning message is displayed (55) on monitor 25 informing the user of the lack of proper connections and process 50 reinitializes (52) the test instruments.

If the connections are good, process 50 reads (56) the user's inputs to determine if the test will be in a manual mode or an automatic mode. If the user makes no inputs, process 50 defaults to the automatic mode.

Figure 6:
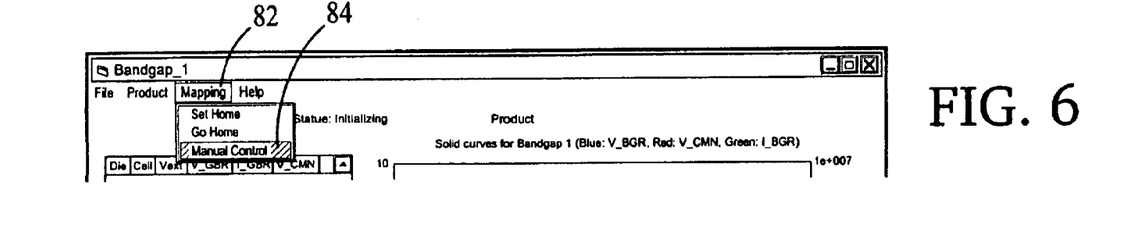
FIG. 6 is a screenshot of a toolbar.
Figure 7:
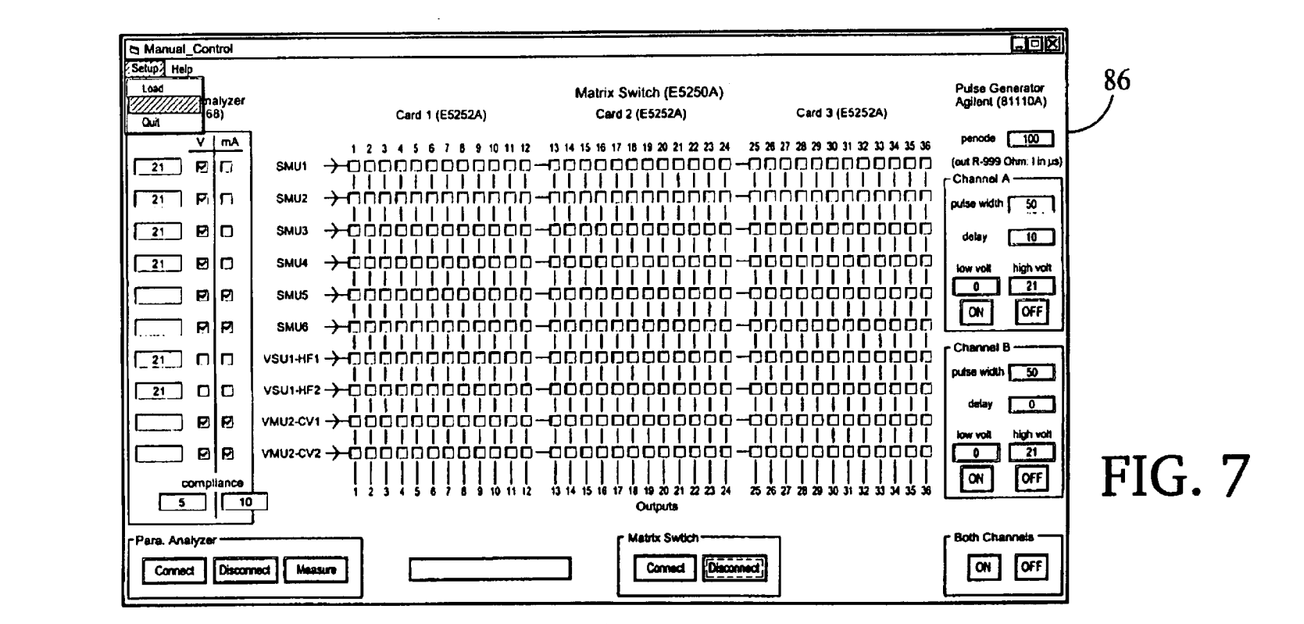
FIG. 7 is a screenshot of a manual control user interface.

Referring to FIGS. 6 and 7, in the manual mode, process 50 receives (58) user manual control inputs. The user manually places probe needles 40 in contact with bond pads 34. The user selects a toolbar command by moving the mouse cursor and clicking-on a "Mapping" menu 82 and then selecting "manual control" 84 from the "Mapping" menu in turn brings up a manual control user interface 86. In manual control user interface 86, the user can configure test instruments 13 by controlling the parameters of each of the instruments including, for example, voltage and current characteristics and the timing characteristics associated with each. Process 50 sends (59) the electrical set-up to the test instruments 13 and displays (59) the measured results on GUI 26.

Figure 8:
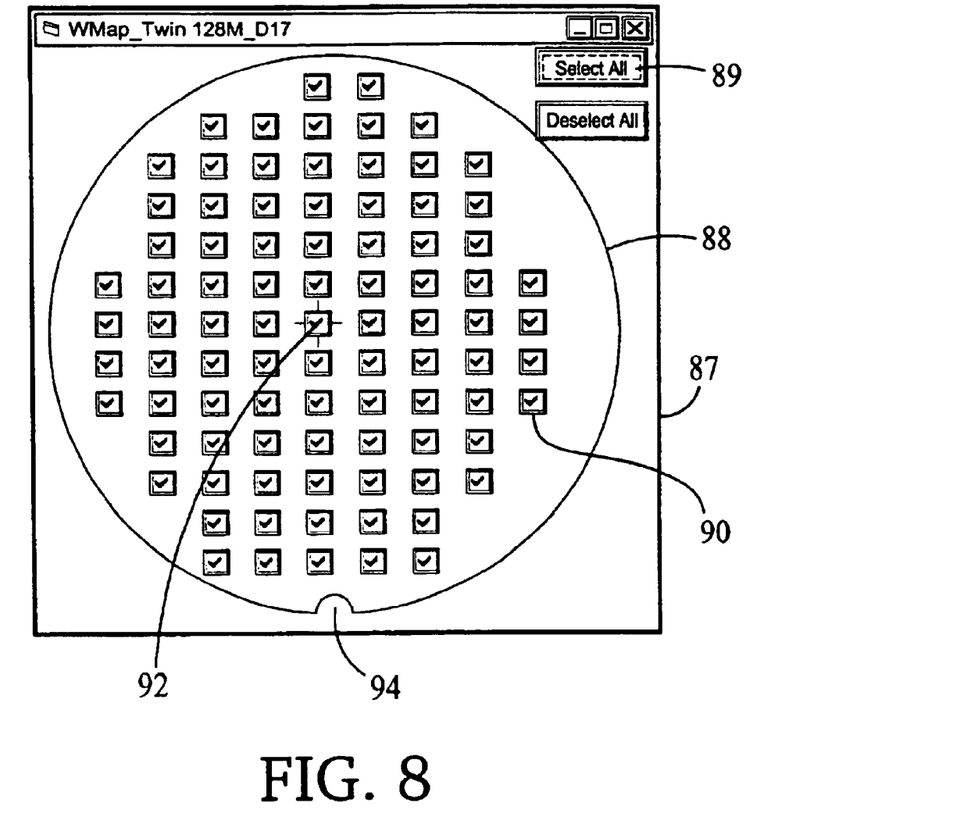
FIG. 8 is a screenshot showing a virtual semiconductor wafer map interface.

Referring to FIG. 8, in the automatic mode, the user has an option of selecting which ICs 44 may be tested by selecting the specific ICs with mouse 24 on a virtual semiconductor wafer map 88 of semiconductor wafer 12. Virtual semiconductor wafer map 88 depicts the positions of the matrix of ICs 11. The user may select the entire matrix of ICs 11 by clicking mouse 24 on a "Select All" button 89 or the user may put the mouse on individual squares 90 representing each of the individual ICs 44 and clicking the desired squares thus selecting the corresponding IC. Virtual semiconductor wafer map 88 leaves a check mark on each square selected for testing. An orientation notch 94 in virtual map 88 corresponds to a notch normally found on semiconductor wafers. A center square 92 is highlighted in a bright color (e.g., red) to orientate the user as to the center of the virtual semiconductor wafer map 88.

Figure 9A:
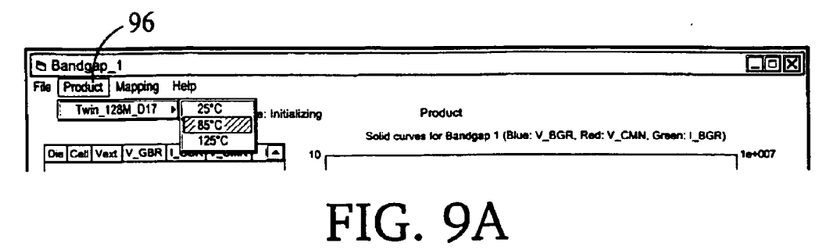
FIG. 9A is a screenshot of the toolbar showing a set of submenus a Product menu.
Figure 9B:
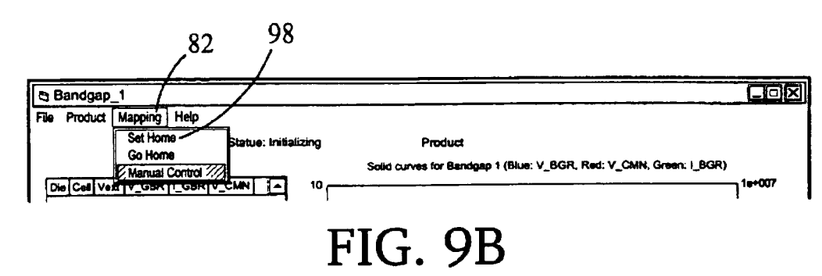
FIG. 9B is a screenshot of a toolbar showing the menus under a Mapping menu.

Referring to FIGS. 9A and 9B, in the automatic mode, the limited user inputs includes inputting information in a "Product" menu 96 and a "Set Home" submenu 98 under "Mapping" menu 82. For example, in "Product" menu 96, the user selects which type of IC 44 is tested and at what temperature the test will be performed. By selecting "Product" menu 96, the process uses a predefined set of delta X1 31, delta Y1 33, delta X2 35 and delta Y2 37 values for a product selected and the temperature selected. The product represents different configurations of IC 44. Since each product is designed differently, these delta distances will be different. More importantly, due to the thermal expansion and contraction of the ICs 44 during heat changes, these delta distances are different by the temperature selected even for the same product. In the automatic mode, the user must also select "Set Home" submenu 98. By selecting "Set Home" submenu 98, the user confirms that probe card 20 is positioned on semiconductor wafer 12 and on a first row 36a of the center IC 44 of semiconductor wafer 12. The user can use center square 92 and notch 94 to visually verify this.

Figure 10:
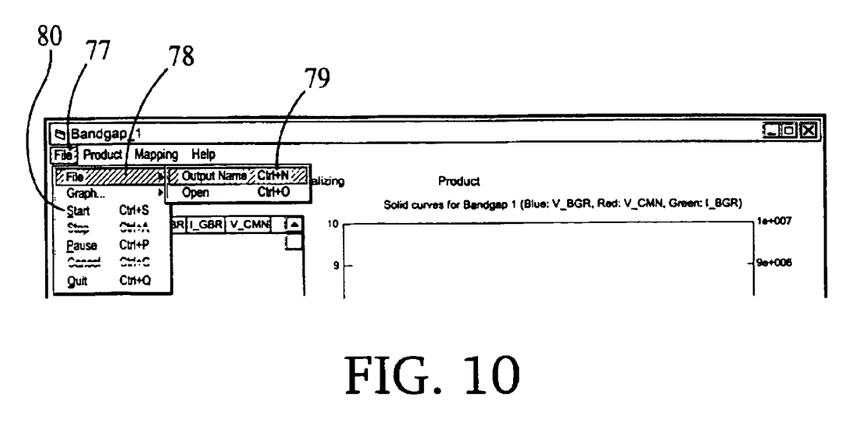
FIG. 10 is a screen shot of a toolbar showing an Output Name submenu.

Referring to FIG. 10, the user can also give a name to an output file by selecting a "File" menu 77, selecting "File" submenu 78 and selecting "Output Name" submenu 79. When a "Start" submenu 80 is selected by a mouse command to commence testing, process 50 determines (60) if "Product" menu 96 and "Set Home" submenu 98 received user input. If not, a prompt window indicates to the user that action needs to be taken by the user to correct the situation.

Process 50 generates (62) the output file so that the measured data collected may be stored on computer 23 and assigns (62) an IC index to the number of ICs 44 selected for test. In addition, a row index is assigned indicating the number of rows 36 to be tested. Process 50 checks (64) to determine that at least one IC is chosen for test. If at least one IC is not chosen, process 50 displays (65) a prompt window warning the user to take action.

Process 50 decrements (66) the IC index by one. Process 50 checks (68) to see if there are any additional ICs 44 to test by checking to see if the IC index is zero. If the IC index is zero, process 50 saves (70) the last measurement data in the file output file and closes the output file.

If additional ICs 44 still need to be tested on semiconductor wafer 12, process 50 sends (72) commands to test instruments 13 with assigned parameters. The distance of IC 44 from the center square 92 is calculated using delta X1 31 and delta Y1 33 values and relaying the data to probe station 28 following chuck 30 separation. The row index is decremented by one. Process 50 checks (74) and determines if there are any additional rows 36 available. If not, process 50 decrements (66) IC index by one to reflect the number of ICs left to test. If additional rows 36 have not been tested (i.e., row index is not equal to zero), process 50 sends (76) commands to probe station 28 for chuck 30 to separate from probe card 20 (i.e., probe card moves in a negative z-direction). Process 50 sends (76) commands to probe station 20 to move a distance delta X2 35 and a second distance delta Y2 37 as appropriate to move probe needles 40 to a new row of pads 34. Process 50 also sends (76) commands to enable test instruments 13. For example, process 50 triggers the pulse generator to get a package of 1,000 pulses at 1 MHz. Different test measurements can require different actions from test instruments 13. For example, in testing capacitance, after a series of charging and discharging of the parasitic capacitances in a cell 32, process 50 sends a command to the parametric analyzer 14 to retrieve and record the currents. The capacitance value is determined from the inputs and saved in the output file. After test instruments 13 send and receive electrical data, process 50 decrements (66) the row index. In this embodiment, the number of probe needles 40 is equal to the number of pads 34 in row 36 so that there is no need for chuck 30 to move a delta X2 35 value within row 36.

Figure 11:
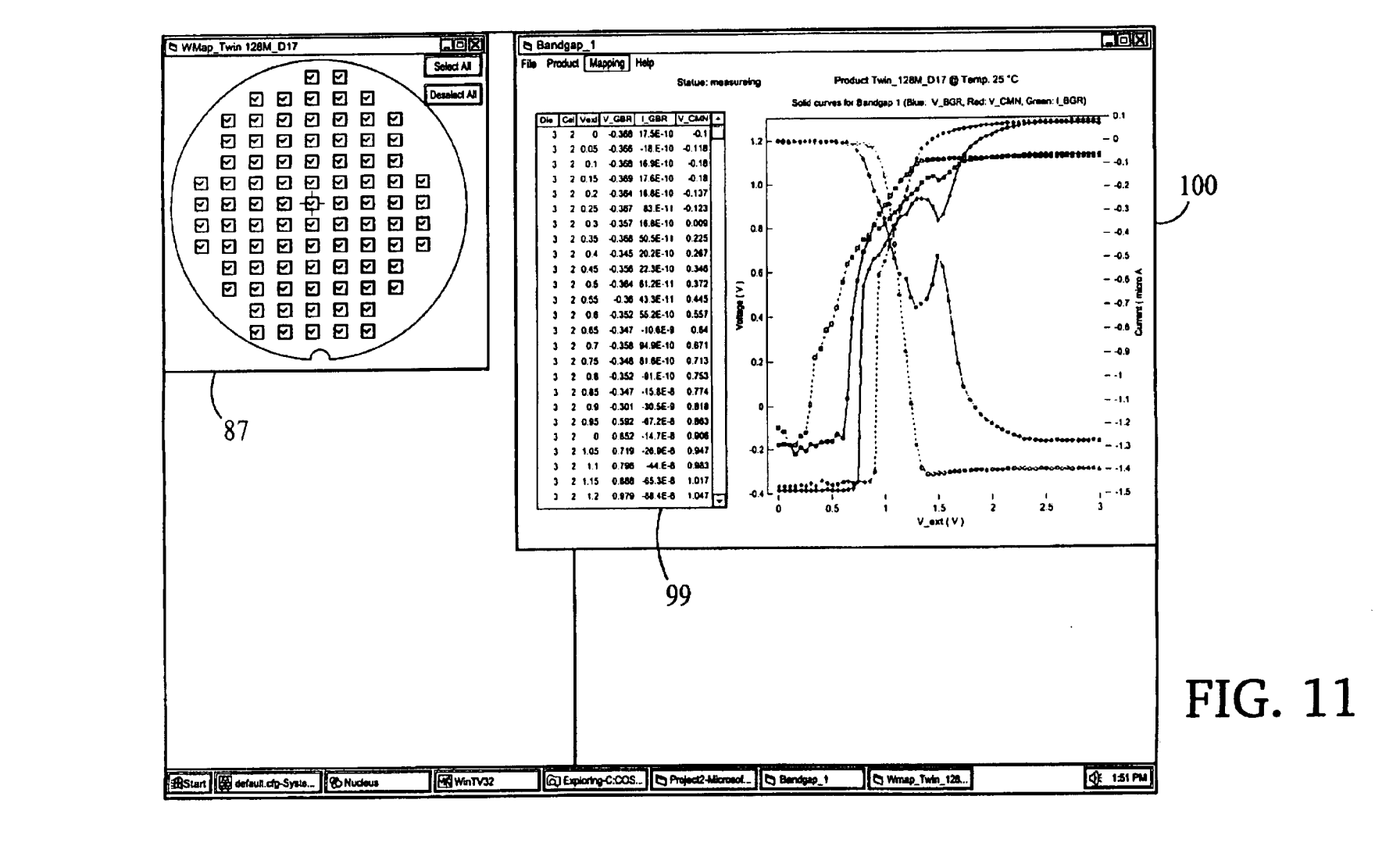
FIG. 11 is a screenshot of the virtual semiconductor wafer map and the GUI for silicon band gap measurement.

Referring, to FIG. 11, the user is able to observe the testing process for each test performed as the data is collected. For example, the user can view virtual semiconductor wafer map 87 while observing the curves on a graphical display 100. As each IC 44 is tested GUI 26 shades in each square 90 of virtual semiconductor wafer display 87. In addition, the user can read the data from a table 99 to determine which cell 32 in which IC 44 is being measured. When the test is completely performed, the user has the capability to load the data saved in a file for display in table 99 and in graph 100 while also viewing virtual map 87. A set of graphs are sequentially displayed one after another with a three to five second delay to allow the user to print or save the displayed graph in a graph format file, or to allow the user to freeze graph 100 by clicking on F10 keyboard key.

In this embodiment, parametric analyzer 14 is a Hewlett-Packard HP-4156B, matrix switch 16 is an Agilent E5250A, Pulse generator 18 is an Agilent 81110A, and probe station 28 is a Cascade Microtech, Inc, Summit 300 mm. Other test instruments that perform similar functions may also be used. Interface cable 22 is a shielded General Purpose Interface Bus (GPIB) cable manufactured by National Instruments.

Figure 12:
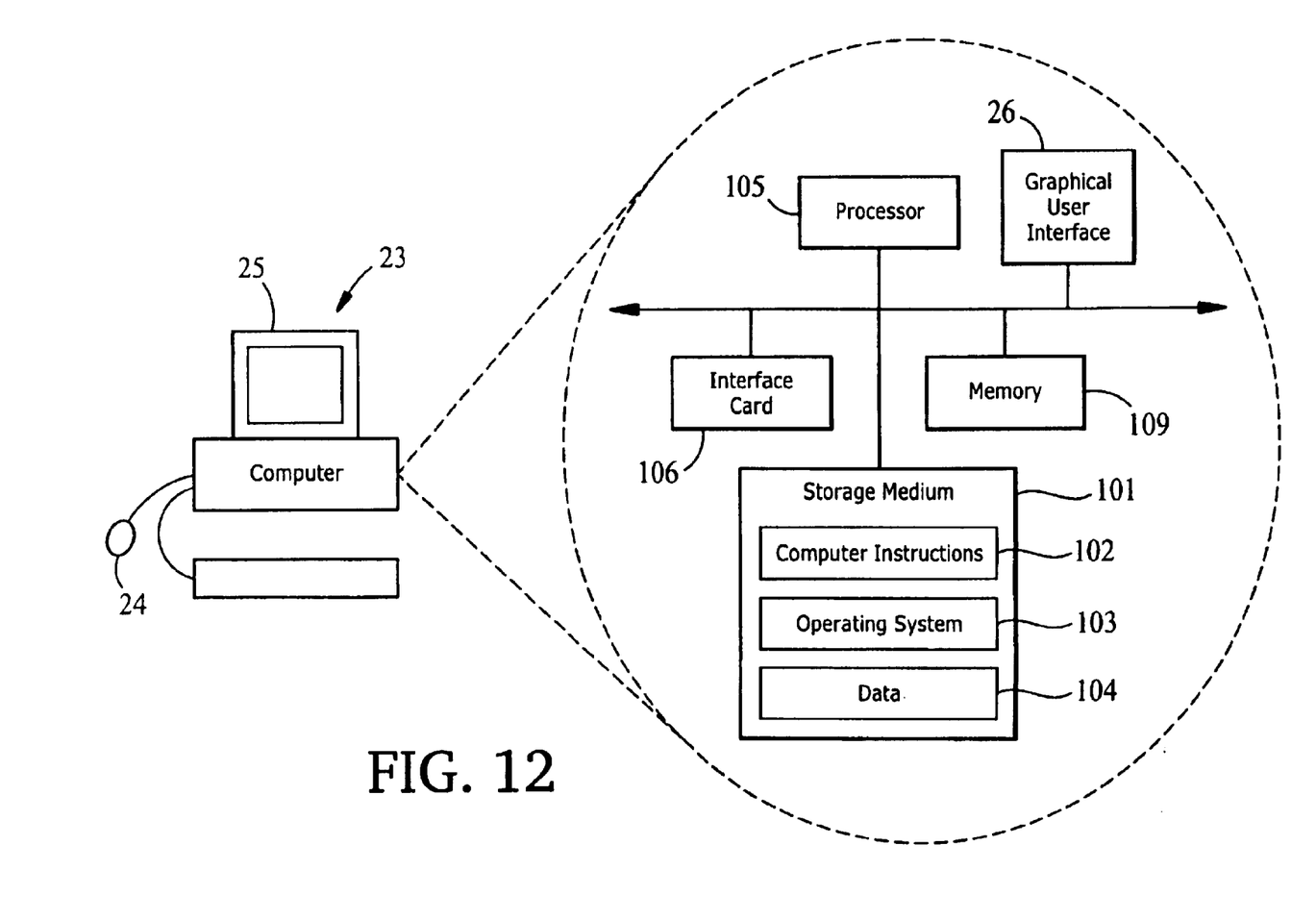
FIG. 12 is a block diagram of a computer system on which the process of FIG. 5 may be implemented.

FIG. 12 shows a computer 23 for testing the matrix of ICs 11 using process 50. Computer 23 includes a storage medium 101 (e.g., hard disk), a processor 105, and interface card 106, a memory 109, and GUI 26 for testing the matrix of ICs 11 and the corresponding cells 32 in FIGS. 2 and 3. Storage medium 101 stores operating system 103, data 104, and computer instructions 102 which are executed by processor 105 out of memory 109 to perform process 50. Interface card 106 ensures the communication between computer 23 and the set of instruments 13 and probe station 28 via GPIB cable 22. In this embodiment, interface card 106 is a peripheral component interconnect (PCI)-GPIB card manufactured by National Instruments.

In this embodiment, the software program is written in Microsoft Visual Basic 6.0. Process 50 is not limited to use with the hardware and software of FIG. 12 it may find applicability in any computing or processing environment and with any type of machine that is capable of running a computer program. Process 50 may be implemented in hardware, software, or a combination of the two. Process 50 may be implemented in computer programs executed on programmable computers/machines that each include a processor, a storage medium/article readable by the processor (including volatile and non-volatile memory and/or storage elements), at least one input device, and one or more output devices. Program code may be applied to data entered using an input device to perform process 50 and to generate output information.

Each such program may be implemented in a high level procedural or objected-oriented programming language to communicate with a computer system. However, the programs can be implemented in assembly or machine language. The language may be a compiled or an interpreted language. Each computer program may be stored on a storage medium (article) or device (e.g., CD-ROM, hard disk, or magnetic diskette) that is readable by a general or special purpose programmable computer for configuring and operating the computer when the storage medium or device is read by the computer to perform process 50. Process 50 may also be implemented as a machine-readable storage medium, configured with a computer program, where upon execution, instructions in the computer program cause the computer to operate in accordance with process 50.

The invention is not limited to the specific embodiments described herein. For example, the invention can be used to move any probe card along any surface. Other I/O interfaces can be used instead of mouse 24 (e.g., a keyboard, trackball, input tablet, joystick). The invention is also not limited to testing ICs on semiconductor wafers, but on ICs detached from the semiconductor wafer. The invention is not limited to the specific processing order of FIG. 5. Rather, the blocks of FIG. 5 may be re-ordered, as necessary, to achieve the results set forth above.

Other embodiments not described here are also within the scope of the following claims.

What is claimed is:

1. A system, comprising:
   an input/output device of a computer system, the input/output device providing a graphical user interface (GUI);
   one or more test instruments for producing electrical signals;
   a probe card having probe needles used for measuring electronic characteristics of devices on a semiconductor wafer, each device having cells, each cell having bond pads, the bond pads being spaced apart by a multiple of a first distance and a multiple of a second distance;
   a memory to store a predefined set of value corresponding to a temperature;
   a matrix switch; and
   an interface conduit electrically connecting the one or more test instruments, the computer system, the probe card, and the matrix switch, the semiconductor wafer being configured to move so that the probe needles measure the electrical characteristics of each cell for each device selected for testing based on a predefined value for the first distance and a predefined value for the second distance, each predefined value corresponding to a testing temperature.

2. The system of claim 1 wherein a user selects a test configuration by interfacing the matrix switch through the GUI.

3. The system of claim 2 wherein the user selects either an automatic test mode or a manual test mode of the semiconductor wafer, the automatic test mode allows the user to select devices for testing.

4. The system of claim 3 wherein the manual test mode includes the user setting the electrical signals of the test instruments through the GUI.

5. The system of claim 4 wherein the probe card transmits electrical signals from each test instrument through the probe needles to the bond pads and generating a test result for each device that is displayed graphically on the display.

6. The system of claim 5 wherein the test instruments include:
   a pulse generator; and
   a parametric analyzer.

7. The system of claim 1 wherein the testing includes measuring a silicon band gap voltage.

8. The system of claim 1 wherein the testing includes measuring a capacitance.

9. A method, comprising:
   selecting a test configuration through a graphical user interface (GUI) connected to an input/output (I/O) device of a computer;
   selecting a temperature for testing; and
   measuring electrical characteristics of each device on a semiconductor wafer selected for testing, the probe card having probe needles, each device having cells, each cell having bond pads, each bond pad being separated by a multiple of a first distance and a multiple of a second distance;
   selecting a predefined value for the first distance and a predefined value for the second distance from a set of predefined values based on the temperature, each predefined value corresponding to a temperature;
   using the predefined value for the first distance and the predefined value for the second distance to move the semiconductor wafer so that the probe needles measure the electrical characteristics of each cell for each device selected for testing.

10. The method of claim 9, further comprising sending a signal to activate test instruments.

11. The method of claim 10, further comprising determining if the test instruments are electrically connected.

12. The method of claim 11, further comprising designating if testing is an automatic test mode or a manual test mode, the automatic test mode includes selecting devices on a semiconductor wafer for testing, the manual test mode includes the user setting the electrical signals of the test instruments through the GUI.

13. The method of claim 12, further comprising generating an output file for all devices tested.

14. The method of claim 13, further comprising graphing data in the output file on a display.

15. The method of claim 14 wherein the test instruments include:
    a pulse generator; and
    a parametric analyzer.

16. The method of claim 1 wherein the testing includes measuring a silicon band gap voltage.

17. The method of claim 1 wherein the testing includes measuring a capacitance.

18. An apparatus for testing devices on a semiconductor wafer using a graphical interface (GUI) comprising:
    a memory that stores executable instructions; and
    a processor that executes the instructions to:
      select a test configuration using the GUI;
      select a predefined value for a first distance and a predefined value for a second distance from a set of predefined values based on a temperature selected for testing, each predefined value corresponding to a temperature;
      measure electrical characteristics of each device selected for testing, the probe card having probe needles, each device having cells, each cell having bond pads; and
      use the predefined value for the first distance and the predefined value for the second distance to move the semiconductor wafer so that the probe needles measure the electrical characteristics of each cell for each device selected for testing.

19. The apparatus of claim 18, further comprising instructions that cause the machine to send a signal to activate test instruments.

20. The apparatus of claim 19, further comprising instructions that cause the machine to determine if the test instruments are electrically connected.

21. The apparatus of claim 20, further comprising instructions that cause the machine to designate if testing is an automatic test mode or a manual test mode, the automatic test includes selecting devices on a semiconductor wafer for testing, the manual test mode includes the user setting the electrical signals of the test instruments through the GUI.

22. The apparatus of claim 21, further comprising instructions that cause the machine to:

generate data in an output file for all devices tested; and graph data in the output file on a display.

23. The apparatus of claim 18 wherein the testing includes measuring a silicon band gap voltage.

24. The apparatus of claim 18 wherein the testing includes measuring a capacitance.

25. An article comprising a machine-readable medium that stores executable instructions for testing devices on a semiconductor wafer, the instructions causing a machine to:

select a test configuration using a graphical user interface (GUI);

select a predefined value for a first distance and a predefined value for a second distance from a set of predefined values based on a temperature selected for testing, each predefined value corresponding to a temperature;

measure electrical characteristics of each device selected for testing, the probe card having probe needles, each device having cells, each cell having bond pads; and use the predefined value for the first distance and the predefined value for the second distance to move the semiconductor wafer so that the probe needles measure the electrical characteristics of each cell for each device selected for testing.

26. The article of claim 25, further comprising instructions that cause the machine to send a signal to activate test instruments.

27. The article of claim 26, further comprising instructions that cause the machine to determine if the test instruments are electrically connected.

28. The article of claim 27, further comprising instructions that cause the machine to designate if testing is an automatic test mode or a manual test mode, the automatic test mode includes selecting devices on a semiconductor wafer for testing, the manual test mode includes the user setting the electrical signals of the test instruments through the GUI.

29. The article of claim 28, further comprising instructions that cause the machine to:

generate data in an output file for all devices tested; and graph data in the output file on a display.

30. The article of claim 29 wherein the test instruments include:

a pulse generator; and a parametric analyzer.

31. The article of claim 25 wherein the testing includes measuring a silicon band gap voltage.

32. The article of claim 25 wherein the testing includes measuring a capacitance.

* * * * *

UNITED STATES PATENT AND TRADEMARK OFFICE
CERTIFICATE OF CORRECTION

PATENT NO. : 6,782,331 B2
DATED : August 24, 2004
INVENTOR(S) : Kamel Ayadi It is certified that error appears in the above-identified patent and that said Letters Patent is hereby corrected as shown below:

Column 7,
Line 24, between "of" and "value" insert -- values for the first distance and for the second distance, each predefined --.

Signed and Sealed this

Seventh Day of March, 2006

JON W. DUDAS
*Director of the United States Patent and Trademark Office*